(12) United States Patent
Takai et al.

(10) Patent No.: US 11,349,451 B2
(45) Date of Patent: May 31, 2022

(54) ELASTIC WAVE DEVICE, HIGH-FREQUENCY FRONT-END CIRCUIT, AND COMMUNICATION APPARATUS

(71) Applicant: Murata Manufacturing Co., Ltd., Nagaokakyo (JP)

(72) Inventors: Tsutomu Takai, Nagaokakyo (JP); Koji Yamamoto, Nagaokakyo (JP); Hideki Iwamoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 815 days.

(21) Appl. No.: 16/242,048

(22) Filed: Jan. 8, 2019

(65) Prior Publication Data

US 2019/0260349 A1 Aug. 22, 2019

(30) Foreign Application Priority Data

Feb. 16, 2018 (JP) .............................. JP2018-025579

(51) Int. Cl.
| | |
|---|---|
| *H03H 9/02* | (2006.01) |
| *H01L 41/047* | (2006.01) |
| *H01L 41/053* | (2006.01) |
| *H03H 9/25* | (2006.01) |
| *H03H 9/54* | (2006.01) |
| *H01L 41/18* | (2006.01) |
| *H03H 9/05* | (2006.01) |

(52) U.S. Cl.
CPC ....... *H03H 9/02574* (2013.01); *H01L 41/047* (2013.01); *H01L 41/053* (2013.01); *H01L 41/18* (2013.01); *H03H 9/02566* (2013.01); *H03H 9/058* (2013.01); *H03H 9/25* (2013.01); *H03H 9/54* (2013.01)

(58) Field of Classification Search
CPC ........... H03H 9/02574; H03H 9/02566; H03H 9/058; H03H 9/25; H01L 41/047; H01L 41/053; H01L 41/18
See application file for complete search history.

(56) References Cited

U.S. PATENT DOCUMENTS

| | | | |
|---|---|---|---|
| 2008/0061657 A1* | 3/2008 | Matsuda | ............ H03H 9/02574 310/334 |
| 2008/0067891 A1 | 3/2008 | Matsuda et al. | |
| 2013/0285768 A1 | 10/2013 | Watanabe et al. | |

FOREIGN PATENT DOCUMENTS

| | | |
|---|---|---|
| KR | 10-2008-0026061 A | 3/2008 |
| KR | 10-2015-0061029 A | 6/2015 |
| WO | 2012/086639 A1 | 6/2012 |

* cited by examiner

*Primary Examiner* — Derek J Rosenau
(74) *Attorney, Agent, or Firm* — Keating & Bennett, LLP

(57) ABSTRACT

An elastic wave device includes a $SiN_x$ layer stacked directly or indirectly on a supporting substrate made of a semiconductor material, a piezoelectric film stacked on directly or indirectly the $SiN_x$ layer, and an interdigital transducer electrode stacked directly or indirectly on at least one main surface of the piezoelectric film. In the $SiN_x$ layer, x is about 1.34 or more and about 1.66 or less.

20 Claims, 3 Drawing Sheets

ELASTIC WAVE DEVICE, HIGH-FREQUENCY FRONT-END CIRCUIT, AND COMMUNICATION APPARATUS

CROSS REFERENCE TO RELATED APPLICATIONS

This application claims the benefit of priority to Japanese Patent Application No. 2018-025579 filed on Feb. 16, 2018. The entire contents of this application are hereby incorporated herein by reference.

BACKGROUND OF THE INVENTION

1. Field of the Invention

The present invention relates to an elastic wave device including a low-acoustic-velocity film and a piezoelectric film that are stacked on a $SiN_x$ layer defining and functioning as a high-acoustic-velocity film, a high-frequency front-end circuit, and a communication apparatus, each including the elastic wave device.

2. Description of the Related Art

Elastic wave devices each including a low-acoustic-velocity film and a piezoelectric film stacked on a high-acoustic-velocity film have been known. In an elastic wave device described in International Publication No. 2012/086639, a multilayer body in which a high-acoustic-velocity film, a low-acoustic-velocity film, and a piezoelectric film are stacked, in this order, on a supporting substrate is used. An interdigital transducer electrode is disposed on the piezoelectric film.

International Publication No. 2012/086639 states that the supporting substrate may be composed of, for example, any of various insulating ceramic materials, a dielectric material such as glass, a semiconductor material such as silicon or gallium nitride, or a resin substrate. The high-acoustic-velocity film may be composed of, for example, aluminum nitride, aluminum oxide, silicon nitride, or silicon oxynitride. Examples of a material of the low-acoustic-velocity film include silicon oxide, glass, and silicon oxynitride.

However, the inventors of preferred embodiments of the present invention have discovered that in the elastic wave device described in International Publication No. 2012/086639, in the case in which a supporting substrate is composed of a semiconductor material and a high-acoustic-velocity film is composed of silicon nitride, the intermodulation (IMD) characteristics are degraded, depending on the composition thereof, and the silicon nitride film is self-destroyed, depending on the composition of silicon nitride.

SUMMARY OF THE INVENTION

Preferred embodiments of the present invention provide elastic wave devices each having IMD characteristics that are not easily degraded and including a silicon nitride film that is not easily self-destroyed, and also provide high-frequency front-end circuits and communication apparatuses, each including an elastic wave device according to one of the preferred embodiments of the present invention.

An elastic wave device according to a preferred embodiment of the present invention includes a supporting substrate made of a semiconductor material, a $SiN_x$ layer stacked directly or indirectly on the supporting substrate, a piezoelectric film stacked directly or indirectly on the $SiN_x$ layer, the piezoelectric film including a pair of main surfaces facing away from each other, and an interdigital transducer electrode disposed directly or indirectly on at least one of the main surfaces of the piezoelectric film, in which in the $SiN_x$ layer, x is about 1.34 or more and about 1.66 or less.

According to a preferred embodiment of the present invention, an elastic wave device may further include a low-acoustic-velocity film stacked between the $SiN_x$ layer and the piezoelectric film, in which the acoustic velocity of a bulk wave that propagates through the low-acoustic-velocity film is lower than the acoustic velocity of an elastic wave that propagates through the piezoelectric film.

In an elastic wave device according to a preferred embodiment of the present invention, the semiconductor material may be silicon.

According to a preferred embodiment of the present invention, an elastic wave device may further include an insulating film stacked between the piezoelectric film and the interdigital transducer electrode. Preferably, the insulating film is made of silicon oxide. In this case, the absolute value of the temperature coefficient of resonant frequency (TCF) is able to be reduced to improve the temperature characteristics.

According to a preferred embodiment of the present invention, an elastic wave device may further include a reflector disposed on each side portion of the interdigital transducer electrode in an elastic wave propagation direction, in which the elastic wave device may be an elastic wave resonator.

According to a preferred embodiment of the present invention, an elastic wave device may be a band-pass filter.

According to a preferred embodiment of the present invention, a high-frequency front-end circuit includes an elastic wave device according to a preferred embodiment of the present invention and a power amplifier.

According to a preferred embodiment of the present invention, a communication apparatus includes a high-frequency front-end circuit according to a preferred embodiment of the present invention and an RF signal processing circuit.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments according to the present invention will be described below with reference to the accompanying drawings so as to clarify the present invention.

Preferred embodiments described herein are illustrative. It should be noted that partial replacement and combination of configurations in different preferred embodiments may be made.

Figure 1:
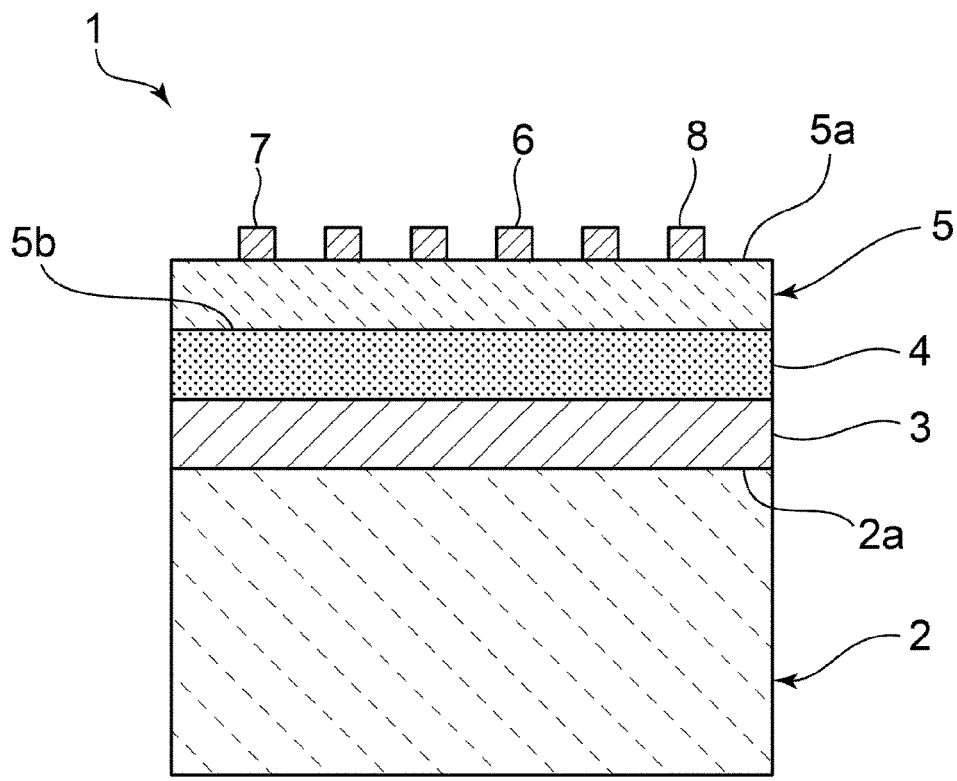
FIG. 1 is an elevational cross-sectional view of an elastic wave device according to a first preferred embodiment of the present invention.

FIG. 1 is an elevational cross-sectional view of an elastic wave device according to a first preferred embodiment of the present invention. An elastic wave device 1 includes a supporting substrate 2 preferably made of a semiconductor material, for example. A $SiN_x$ layer 3 is stacked directly on an upper surface 2a of the supporting substrate 2. The $SiN_x$ layer 3 may be stacked indirectly on the supporting substrate 2. That is, another material layer, such as an insulating film, for example, may be interposed between the supporting substrate 2 and the $SiN_x$ layer 3.

A low-acoustic-velocity film 4 is stacked directly on the $SiN_x$ layer 3. The low-acoustic-velocity film 4 may be stacked indirectly on the $SiN_x$ layer 3. In other words, the low-acoustic-velocity film 4 may be stacked on the $SiN_x$ layer 3 with another material layer interposed therebetween. As the another material layer, for example, a material layer made of an insulating material may be used. The low-acoustic-velocity film 4 is not indispensable in preferred embodiments of the present invention.

A piezoelectric film 5 is stacked on the low-acoustic-velocity film 4. The piezoelectric film 5 is stacked directly on the low-acoustic-velocity film 4 but may be stacked indirectly on the low-acoustic-velocity film 4. That is, another material layer, such as an insulating layer, for example, may be interposed between the low-acoustic-velocity film 4 and the piezoelectric film 5.

The piezoelectric film 5 includes a first main surface 5a and a second main surface 5b facing away from each other. An interdigital transducer electrode 6 is disposed on the first main surface 5a. Reflectors 7 and 8 are disposed on the respective side portions of the interdigital transducer electrode 6 in an elastic wave propagation direction.

The reflectors 7 and 8 of the interdigital transducer electrode 6 may be disposed on the second main surface 5b or may be disposed both of the first main surface 5a and the second main surface 5b.

The low-acoustic-velocity film 4 is made of a low-acoustic-velocity material in which the acoustic velocity of a bulk wave that propagates through the low-acoustic-velocity material is lower than the acoustic velocity of an elastic wave that propagates through the piezoelectric film 5. As the low-acoustic-velocity material, for example, a medium mainly including silicon oxide, glass, silicon oxynitride, tantalum oxide, or a compound including a silicon oxide doped with fluorine, carbon, or boron may preferably be used.

The $SiN_x$ layer 3 is made of a high-acoustic-velocity material. The high-acoustic-velocity material used here refers to a material in which the acoustic velocity of a bulk wave that propagates through the high-acoustic-velocity material is higher than the acoustic velocity of an elastic wave that propagates through the piezoelectric film 5.

In the elastic wave device 1, because the low-acoustic-velocity film 4 and the $SiN_x$ layer 3 defining and functioning as a high-acoustic-velocity film are stacked below the piezoelectric film 5, elastic wave energy is confined to the piezoelectric film 5. In this case, the piezoelectric film 5 preferably has a thickness of, for example, about 3.5λ or less, and more preferably about 0.5λ or less. The elastic wave energy is effectively confined to the piezoelectric film 5.

The supporting substrate 2 is made of a semiconductor material. Non-limiting examples of the semiconductor material include silicon, gallium nitride, gallium arsenide, and oxide semiconductor materials. In the present preferred embodiment, the supporting substrate 2 is preferably made of silicon, for example. The inventors of preferred embodiments of the present invention have first discovered that in the case in which the supporting substrate 2 of the elastic wave device 1 is made of a semiconductor material, the IMD characteristics are degraded, and the $SiN_x$ layer 3 is self-destroyed, depending on the composition of the $SiN_x$ layer 3.

A metal material included in each of the interdigital transducer electrode 6 and the reflectors 7 and 8 is not particularly limited. Examples of the metal material that may be used include metals such as Al, Cu, Pt, Au, Ag, Ti, Ni, Cr, Mo, and W; and alloys mainly including these metals. A multilayer metal film in which metal layers are stacked may also be used.

In the elastic wave device 1 having the foregoing structure, x of the $SiN_x$ layer 3 is preferably in a range of about 1.34 or more and about 1.66 or less, for example. Thus, the degradation of the IMD characteristics is reduced or prevented, and the $SiN_x$ layer 3 is not easily self-destroyed. This will be described below by specific examples.

The elastic wave devices 1 including the $SiN_x$ layers 3 having different values x of $SiN_x$ were produced. The design parameters are described below. A wavelength determined by the electrode finger pitch of the interdigital transducer electrode 6 was denoted by λ.

The supporting substrate 2 was made of silicon.

The $SiN_x$ layer 3 was made of $SiN_x$ and had a thickness of about 0.5λ.

The low-acoustic-velocity film 4 was made of silicon oxide and had a thickness of about 0.35λ.

The piezoelectric film 5 was made of LT and had a thickness of about 0.3λ.

Each of the interdigital transducer electrode 6 and the reflectors 7 and 8 was made of aluminum and had a thickness of about 0.08λ. The wavelength λ determined by the electrode finger pitch of the interdigital transducer electrode 6 was about 2 μm. The number of pairs of the electrode fingers of the interdigital transducer electrode was about 94 pairs. The number of the electrode fingers of each of the reflectors 7 and 8 was about 21.

As described above, the elastic wave devices 1 having different values of x of $SiN_x$ were produced. IMD characteristics were measured by a method described below.

The method for measuring IMD characteristics was performed as follows. A transmission wave was input from a transmitting (TX) terminal, and a disturbing wave was input from an antenna (ANT) terminal with a signal generator. A distorted wave was detected from a receiving (RX) terminal with a signal analyzer to measure third-order intermodulation distortion.

Figure 2:
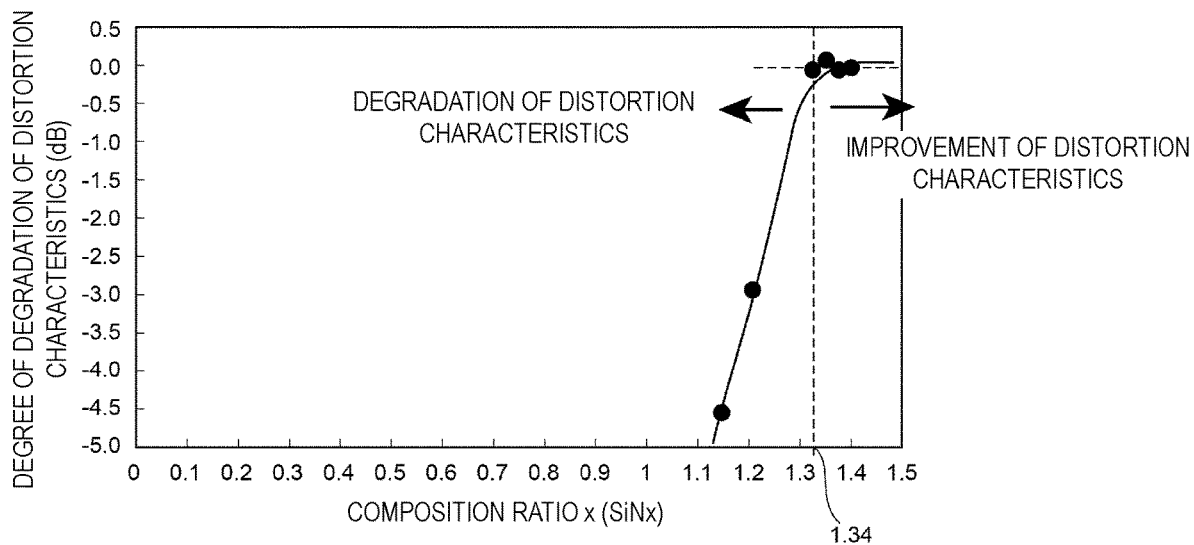
FIG. 2 is a graph illustrating the relationship between x of $SiN_x$ and the degree of degradation of third-order distortion characteristics as IMD characteristics.

FIG. 2 illustrates the relationship between x of $SiN_x$ and the degree of degradation of the third-order distortion characteristics obtained from the measurement results of the IMD characteristics. FIG. 2 indicates that the IMD characteristics are less likely to degrade when x is about 1.34 or more and that the degree of degradation of the IMD characteristics increases steeply with decreasing x when x is about 1.33 or less. Accordingly, x of $SiN_x$ is preferably about 1.34 or more, for example. In this case, the degradation of the IMD characteristics is able to be reduced or prevented.

It is known that when x of $SiN_x$ is about 1.67 or more, $SiN_x$ may be self-destroyed by moisture absorption. Accordingly, x of $SiN_x$ is preferably less than about 1.67, for example. In this case, the elastic wave device 1 has IMD characteristics that are not easily degraded and includes the $SiN_x$ layer 3 that is not easily self-destroyed.

It is believed that the IMD characteristics are not easily degraded when x of $SiN_x$ is about 1.34 or more because of the following reason.

When the supporting substrate 2 is made of a semiconductor material, a parasitic capacitance component may occur on a surface of the supporting substrate 2. In the elastic wave device 1, however, because the composition of $SiN_x$ is preferably in the foregoing range, i.e., x is about 1.34 or more, blocking properties may be improved between the supporting substrate 2 made of silicon, which is a semiconductor material, and the low-acoustic-velocity film 4 made of silicon oxide, thus reducing or preventing the parasitic capacitance component from occurring on the surface of the supporting substrate 2. This results in a reduced parasitic capacitance component and improved IMD characteristics.

The inventors of preferred embodiments of the present invention have first discovered that in the case in which the elastic wave device having the structure in which the supporting substrate, the high-acoustic-velocity film, the low-acoustic-velocity film, and the piezoelectric film are stacked and in which the supporting substrate is made of the semiconductor material, the IMD characteristics are degraded as described above. Furthermore, the inventors of preferred embodiments of the present invention have first discovered that this problem is able to be solved by setting the composition ratio of the $SiN_x$ layer to the above-described range.

Figure 3:
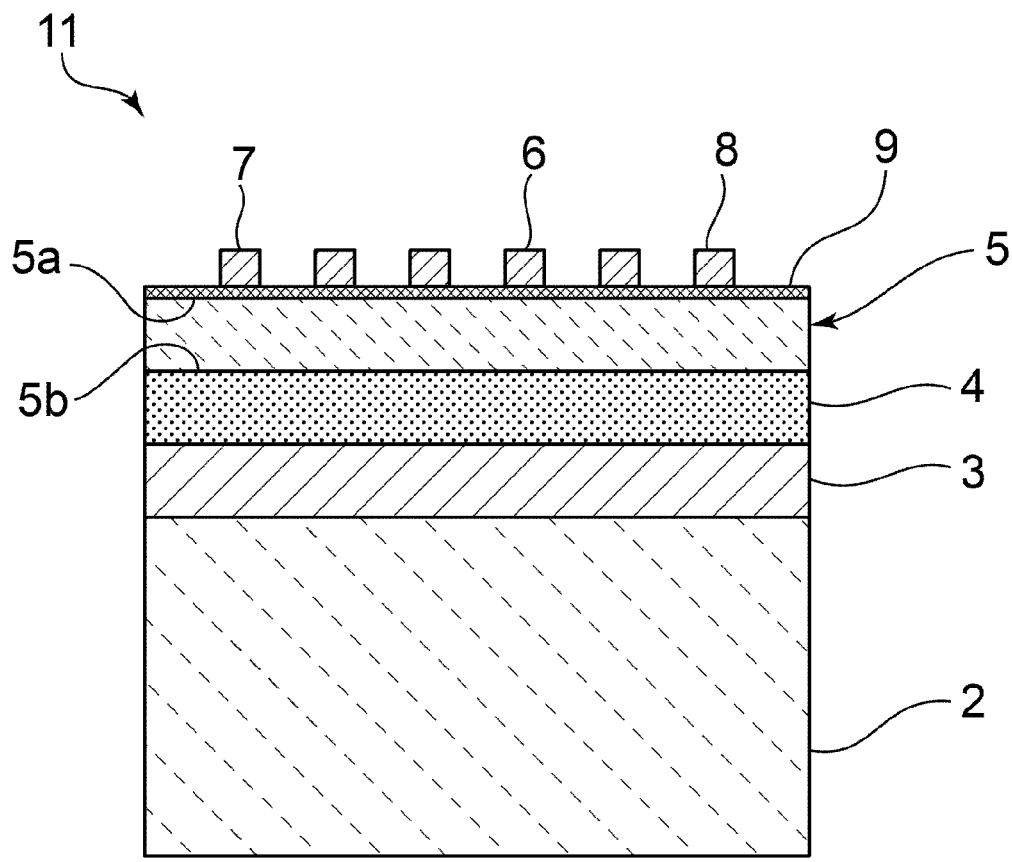
FIG. 3 is an elevational cross-sectional view of an elastic wave device according to a second preferred embodiment of the present invention.
Figure 4:
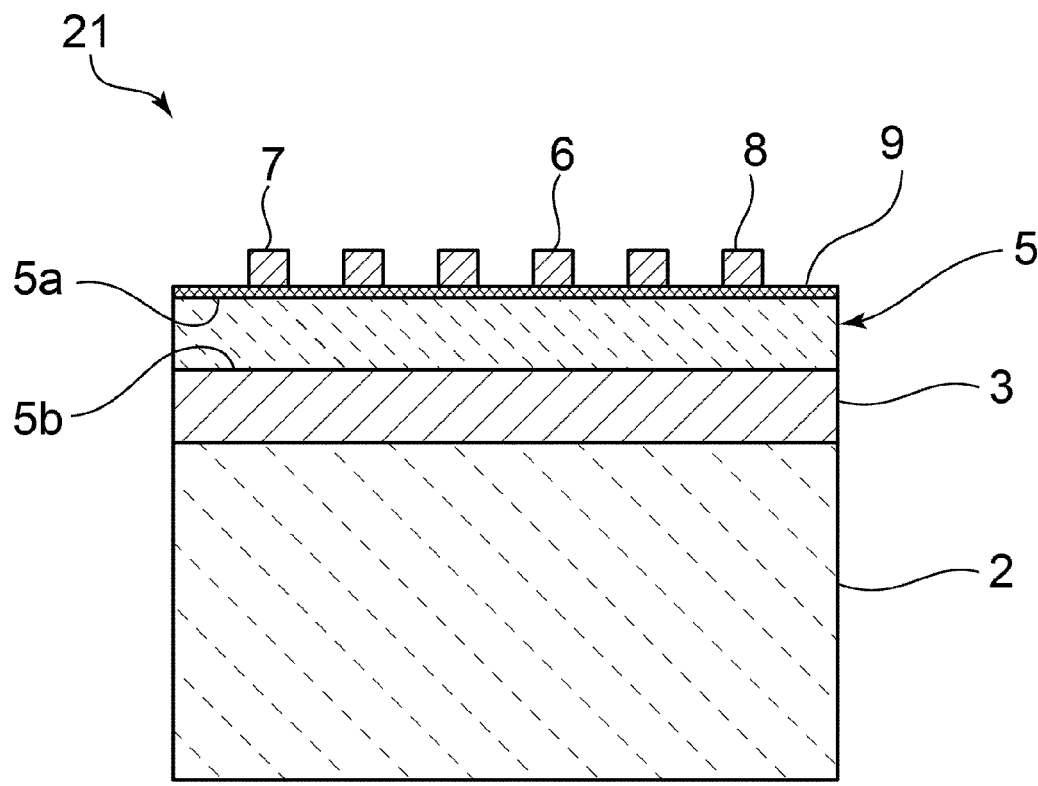
FIG. 4 is an elevational cross-sectional view of an elastic wave device according to a third preferred embodiment of the present invention.

While the interdigital transducer electrode 6 is stacked directly on the first main surface 5a of the piezoelectric film 5 in the first preferred embodiment, in an elastic wave device 11 according to a second preferred embodiment of the present invention as illustrated in FIG. 3, the interdigital transducer electrode 6 may be stacked indirectly on the first main surface 5a of the piezoelectric film 5 with an insulating film 9 interposed therebetween. A material of the insulating film 9 may preferably be, but not limited to, for example, silicon oxide, silicon oxynitride, silicon nitride, tantalum pentoxide, alumina, glass, tantalum oxide, or a compound containing a silicon oxide doped with fluorine, carbon, or boron. In a third preferred embodiment of the present invention as illustrated in FIG. 4, an elastic wave device 21 having a structure in which the low-acoustic-velocity film 4 is omitted from the structure according to the second preferred embodiment may be used.

Figure 5:
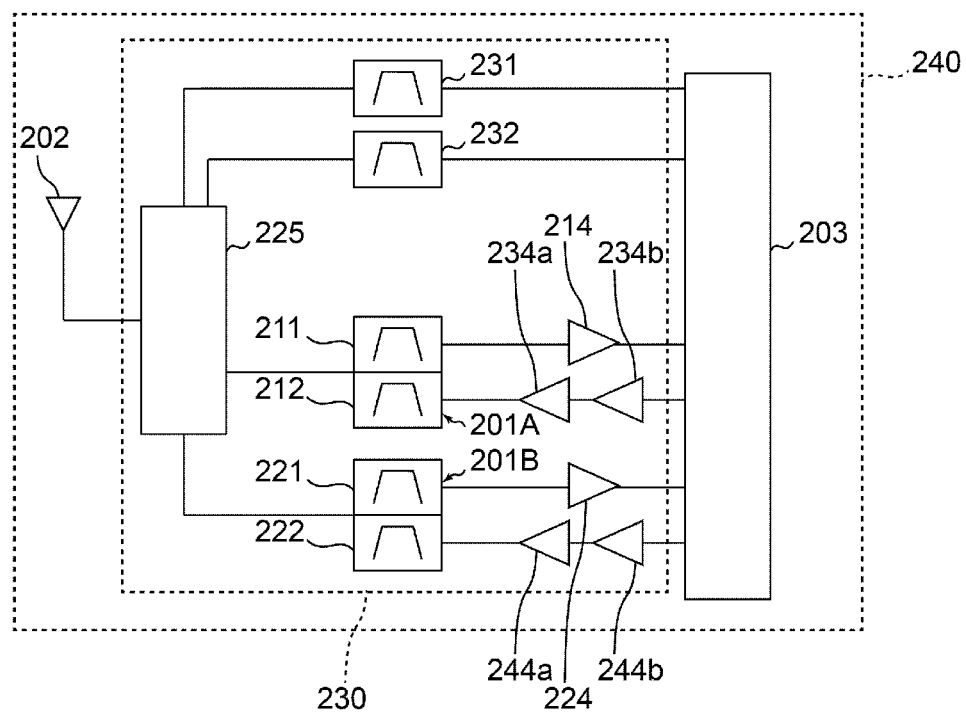
FIG. 5 is a schematic diagram of a communication apparatus including a high-frequency front-end circuit according to a preferred embodiment of the present invention.

FIG. 5 is a schematic diagram of a communication apparatus including a high-frequency front-end circuit. FIG. 5 also illustrates components, such as an antenna element 202 and an RF signal integrated circuit (RFIC) 203, connected to a high-frequency front-end circuit 230. The high-frequency front-end circuit 230 and the RF signal integrated circuit 203 are included in a communication apparatus 240. The communication apparatus 240 may include a power source, a central processing unit (CPU), and a display.

The high-frequency front-end circuit 230 includes a switch 225, duplexers 201A and 201B, filters 231 and 232, low-noise amplifier circuits 214 and 224, and power amplifier circuits 234a, 234b, 244a, and 244b. The high-frequency front-end circuit 230 and the communication apparatus 240 illustrated in FIG. 5 are examples of the high-frequency front-end circuit and the communication apparatus according to preferred embodiments of the present invention. The high-frequency front-end circuit and the communication apparatus are not limited to the configuration.

The duplexer 201A includes filters 211 and 212. The duplexer 201B includes filters 221 and 222. The duplexers 201A and 201B are connected to the antenna element 202 via the switch 225. Elastic wave devices according to the above-described preferred embodiments may be used for the duplexers 201A and 201B or may be used for the filters 211, 212, 221, and 222.

Elastic wave devices according to the above-described preferred embodiments may be used for multiplexers each including three or more filters, for example, triplexers each including three filters that share a common antenna terminal and hexaplexers including six filters that share a common antenna terminal.

Examples of elastic wave devices according to the above-described preferred embodiments include elastic wave resonators, filters, duplexers, and multiplexers each including three or more filters. The configuration of each of the multiplexers is not limited to a configuration including both a transmission filter and a reception filter. Each multiplexer may include only a transmission filter or only a reception filter.

The switch 225 connects the antenna element 202 to at least one signal path corresponding to a predetermined band in response to a control signal from a controller (not illustrated), and may preferably include, for example, a single-pole double-throw (SPDT) switch. The at least one signal path connected to the antenna element 202 may be a plurality of signal paths. That is, the high-frequency front-end circuit 230 may support carrier aggregation.

The low-noise amplifier circuit 214 is a reception amplifier circuit that amplifies a high-frequency signal (in this case, a high-frequency received signal) fed thereto via the antenna element 202, the switch 225, and the duplexer 201A and that feeds the amplified signal to the RF signal integrated circuit 203. The low-noise amplifier circuit 224 is a reception amplifier circuit that amplifies a high-frequency signal (in this case, a high-frequency received signal) fed thereto via the antenna element 202, the switch 225, and the duplexer 201B and that feeds the amplified signal to the RF signal integrated circuit 203.

Each of the power amplifier circuits 234a and 234b is a transmission amplifier circuit that amplifies a high-frequency signal supplied from the RF signal integrated circuit 203 (in this case, a high-frequency transmission signal) and that feeds the amplified signal to the antenna element 202 via the duplexers 201A and the switch 225. Each of the power amplifier circuits 244a and 244b is a transmission amplifier circuit that amplifies a high-frequency signal supplied from the RF signal integrated circuit 203 (in this case, a high-frequency transmission signal) and that feeds the amplified signal to the antenna element 202 via the duplexers 201B and the switch 225.

The RF signal integrated circuit 203 allows a high-frequency reception signal supplied from the antenna element 202 through a reception signal path to be subjected to signal processing such as down-conversion, for example, and feeds a reception signal generated by the signal processing. The RF signal integrated circuit 203 allows a transmission signal fed thereto to be subjected to signal processing such as up-conversion, for example, and feeds a high-frequency transmission signal generated by the signal processing to the power amplifier circuits 234a, 234b, 244a, and 244b. The RF signal integrated circuit 203 is preferably, for example, an RFIC. The communication apparatus may include a baseband integrated circuit (BBIC). In this case, the BBIC processes a reception signal that has been processed by the RFIC. The BBIC processes a transmission signal and feeds the processed signal to the RFIC. The reception signal processed by the BBIC and the transmission signal to be processed with the BBIC are preferably, for example, an image signal and an audio signal.

The high-frequency front-end circuit 230 may include duplexers according to a modification of the duplexers 201A and 201B, instead of the duplexers 201A and 201B.

The filters 231 and 232 in the communication apparatus 240 are connected between the RF signal integrated circuit 203 and the switch 225 without the low-noise amplifier circuit 214 or 224 or the power amplifier circuit 234a, 234b, 244a, or 244b. The filters 231 and 232 are also connected to the antenna element 202 via the switch 225, similarly to the duplexers 201A and 201B.

Because the high-frequency front-end circuit 230 and the communication apparatus 240 having the configuration described above each include an elastic wave device according to preferred embodiments of the present invention as an elastic wave resonator, a filter, a duplexer, a multiplexer including about three or more filters, or other suitable structure, the degradation of the IMD characteristics is reduced or prevented, and the silicon nitride layer is not easily self-destroyed.

The elastic wave devices, the high-frequency front-end circuits, and the communication apparatuses according to preferred embodiments of the present invention have been described. The present invention include other preferred embodiments provided by combinations of the elements in the preferred embodiments described above, modifications obtained by various modifications of the foregoing preferred embodiments conceived by those skilled in the art without departing from the gist of the present invention, and various devices including the high-frequency front-end circuits and the communication apparatuses according to preferred embodiments of the present invention.

Preferred embodiments of the present invention can be widely used in, for example, communication devices, such as cellular phones, as elastic wave resonators, filters, duplexers, multiplexers that can be used in multiband systems, front-end circuits, and communication apparatuses.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
   a supporting substrate made of a semiconductor material;
   a $SiN_x$ layer stacked directly or indirectly on the supporting substrate;
   a piezoelectric film stacked directly or indirectly on the $SiN_x$ layer, the piezoelectric film including a pair of main surfaces facing away from each other; and
   an interdigital transducer electrode disposed directly or indirectly on at least one of the main surfaces of the piezoelectric film; wherein
   in the $SiN_x$ layer, x is about 1.34 or more and about 1.66 or less.

2. The elastic wave device according to claim 1, further comprising:
   a low-acoustic-velocity film stacked between the $SiN_x$ layer and the piezoelectric film; wherein
   an acoustic velocity of a bulk wave that propagates through the low-acoustic-velocity film is lower than an acoustic velocity of an elastic wave that propagates through the piezoelectric film.

3. The elastic wave device according to claim 1, wherein the semiconductor material is silicon.

4. The elastic wave device according to claim 1, further comprising:
   an insulating film stacked between the piezoelectric film and the interdigital transducer electrode.

5. The elastic wave device according to claim 4, wherein the insulating film is made of silicon oxide.

6. The elastic wave device according to claim 1, further comprising:
   a reflector disposed on each side portion of the interdigital transducer electrode in an elastic wave propagation direction; wherein
   the elastic wave device is an elastic wave resonator.

7. The elastic wave device according to claim 1, wherein the elastic wave device is a band-pass filter.

8. A high-frequency front-end circuit comprising:
   the elastic wave device according to claim 1; and
   a power amplifier.

9. The high-frequency front-end circuit according to claim 8, further comprising:
   a low-acoustic-velocity film stacked between the $SiN_x$ layer and the piezoelectric film; wherein
   an acoustic velocity of a bulk wave that propagates through the low-acoustic-velocity film is lower than an acoustic velocity of an elastic wave that propagates through the piezoelectric film.

10. The high-frequency front-end circuit according to claim 8, wherein the semiconductor material is silicon.

11. The high-frequency front-end circuit according to claim 8, further comprising:
    an insulating film stacked between the piezoelectric film and the interdigital transducer electrode.

12. The high-frequency front-end circuit according to claim 11, wherein the insulating film is made of silicon oxide.

13. The high-frequency front-end circuit according to claim 8, further comprising:
    a reflector disposed on each side portion of the interdigital transducer electrode in an elastic wave propagation direction; wherein
    the elastic wave device is an elastic wave resonator.

14. The high-frequency front-end circuit according to claim 8, wherein the elastic wave device is a band-pass filter.

15. A communication apparatus comprising:
    the high-frequency front-end circuit according to claim 8; and
    an RF signal processing circuit.

16. The communication apparatus according to claim 15, further comprising:
    a low-acoustic-velocity film stacked between the $SiN_x$ layer and the piezoelectric film; wherein
    an acoustic velocity of a bulk wave that propagates through the low-acoustic-velocity film is lower than an acoustic velocity of an elastic wave that propagates through the piezoelectric film.

17. The communication apparatus according to claim 15, wherein the semiconductor material is silicon.

18. The communication apparatus according to claim 15, further comprising:
    an insulating film stacked between the piezoelectric film and the interdigital transducer electrode.

19. The communication apparatus according to claim 18, wherein the insulating film is made of silicon oxide.

20. The communication apparatus according to claim 15, further comprising:
- a reflector disposed on each side portion of the interdigital transducer electrode in an elastic wave propagation direction; wherein
- the elastic wave device is an elastic wave resonator.

* * * * *